United States Patent [19]
Parker et al.

[11] Patent Number: 4,614,882
[45] Date of Patent: Sep. 30, 1986

[54] BUS TRANSCEIVER INCLUDING COMPENSATION CIRCUIT FOR VARIATIONS IN ELECTRICAL CHARACTERISTICS OF COMPONENTS

[75] Inventors: Wayne C. Parker, Marlborough; John W. May, Arlington, both of Mass.

[73] Assignee: Digital Equipment Corporation, Maynard, Mass.

[21] Appl. No.: 554,493

[22] Filed: Nov. 22, 1983

[51] Int. Cl.[4] .................... H03K 17/14; H03K 17/687
[52] U.S. Cl. .................................... 307/443; 307/263; 307/297; 307/353; 307/448; 307/475; 307/494
[58] Field of Search ............... 307/443, 448, 475, 263, 307/270, 297, 581, 353, 291, 494, 497; 364/900 MS File

[56]  References Cited
U.S. PATENT DOCUMENTS

| 4,008,406 | 2/1977 | Kawagoe | 307/443 X |
| 4,049,978 | 9/1977 | Dru et al. | 307/270 |
| 4,242,604 | 12/1980 | Smith | 307/443 |
| 4,275,313 | 6/1981 | Boll et al. | 307/448 |
| 4,306,163 | 12/1981 | Blume, Jr. et al. | 307/475 |
| 4,320,521 | 3/1982 | Balakrishnan et al. | 307/263 X |
| 4,394,588 | 7/1983 | Gaudenzi | 307/443 |
| 4,472,647 | 9/1984 | Allgood et al. | 307/475 |
| 4,479,067 | 10/1984 | Fujita | 307/475 |

OTHER PUBLICATIONS

Mead and Conway, "Introduction to VLSI Systems", Addison–Wesley Pub. Co., Reading, Mass., 1980, pp. 164–166.

Primary Examiner—Stanley D. Miller
Assistant Examiner—D. R. Hudspeth
Attorney, Agent, or Firm—Cesari and McKenna

[57]  ABSTRACT

A bus transceiver having a driver with charging/discharging characteristics that are device-independent and a receiver that provides adequate noise immunity is described. The transceiver uses a reference network to modulate the conductance of a depletion device as a function of device parameter variations in order to maintain a constant response time for the driver and optimize peak current. The receiver uses a modified differential amplifier to provide high gain and hysteresis sufficient for a desired level of noise immunity.

12 Claims, 3 Drawing Figures

BUS TRANSCEIVER INCLUDING COMPENSATION CIRCUIT FOR VARIATIONS IN ELECTRICAL CHARACTERISTICS OF COMPONENTS

BACKGROUND

The invention relates generally to the field of input-/output, or transceiver, circuits for use on integrated circuit chips to enable signals to be transmitted from, or received onto, an integrated circuit chip to and from external circuitry.

MOS circuits historically have had limited ability to sink current from, and source current into resistive loads, to drive very large capacitive loads at high speeds, and to afford high noise immunity. However, MOS circuits have improved in their switching speeds and recent short-channel MOS/VLSI technological advances have made even ECL-comparable performance possible in many applications.

As more and more functionality is integrated on-chip, the need for addressing the transient current behavior of MOS/VLSI chip interfaces becomes acute. In ECL designs, the peak current phenomena are dealt with by defining guidelines for packaging considerations (e.g. limiting pincount), but these specifications do not comprehend the high pincounts prevalent in MOS/VLSI designs today. The state-of-the-art in packaging is being sorely pressed by MOS circuit performance now.

The packaging affects the peak current characteristics of high performance MOS/VLSI parts because package pins have inductance. Voltage across an inductor is directly proportional to the inductance and to the rate of change of current through the inductor. Thus, as charge/discharge times decrease in larger capacitive loads, the time-compressed peak current transients can cause deleterious voltage rises at package pins, not to mention the phenomena created at the power/ground busses on-chip.

In new designs, several wires, each with a large capacitive load, are discharged through one ground pin. The need for current limiting is obvious in applications where worst-case speed specifications must be met at the slow corner of a process, even though the circuit may be as much as six times faster at the worst-case current corner of the same process.

In inherently noisy environments, such as a bus, the need for high noise immunity is great in order to guarantee data integrity. TTL technology has good noise characteristics, but MOS technology, with worst-case device threshold values less than 500 mV, is notoriously poor in applications where good low-state input voltage $V_{il}$ noise immunity is required.

A common way of compensating for deficiencies in MOS low-level noise immunity is by level-shifting, but a significant speed penalty may be exacted by the level-shifter stage.

SUMMARY

The present invention provides for a bus transceiver having a driver with charging/discharging characteristics that are device-independent and a receiver that provides adequate noise immunity for input applications. The driver portion of the transceiver is a standard MOS transistor acting as a pull-down device and driven by a pre-driver stage formed by a standard buffering NOR gate. The gate of a depletion pull-up device in the buffer gate is controlled by a reference network, which is basically a buffered differential amplifier whose inputs are driven by an on-chip, ratioed polysilicon resistor network and an off-chip precision resistor network. One off-chip precision resistor is connected in a source-follower configuration with an on-chip depletion device scaled to match the characteristics of the pre-driver's depletion pull-up device. The output of the reference source-follower is fed to the gate of an on-chip enhancement device scaled to match the characteristics of the driver's pull-down device and connected in a common-source configuration with the other off-chip resistor. The output of the reference common-source stage is fed back to the input of the on-chip differential amplifier.

The reference circuit generates a voltage that tends to compensate device variations over the worst-case process and temperature range. The reference voltage is fed to the gates of all pre-driver pull-ups in the bus transceivers. As device parameters vary, the control voltage modulates the "on" conductance of the pull-up depletion device, thereby varying the turn-on characteristic of the open-drain enhancement pull-down device. The operation may be explained in terms of an RC network, where R (depletion pull-up drain-to-source resistance) varies as C (enhancement pull-down gate capacitance) varies so as to keep the driver output response time constant.

The transceiver output devices are sized to meet the worst-case speed and current sinking specifications, and the reference voltage serves to keep the response time equal to the slow value; therefore, the peak current transients are minimized by allowing the circuit to use the maximum time available for bus operation.

The receiver portion is a modified differential amplifier in which the inverted output is fed back to the noninverting input, and the input signal drives the inverting input. The common source device serves a twofold purpose: feedback and second-order level-shifting.

The receiver makes a logic "1" or "0" decision in a specified narrow window with hysteresis, while introducing a propagation delay of slightly more than one gate. Also, true and complement outputs are available for straightforward push-pull buffering. The unique circuit exhibits very high gain at the switch point, and significantly higher $V_{il}$ noise margin than comparable TTL circuits. Additional $V_{il}$ noise margin versus standard NMOS input stages is realized with higher switch-point gain.

DESCRIPTION OF THE INVENTION

Figure 1:
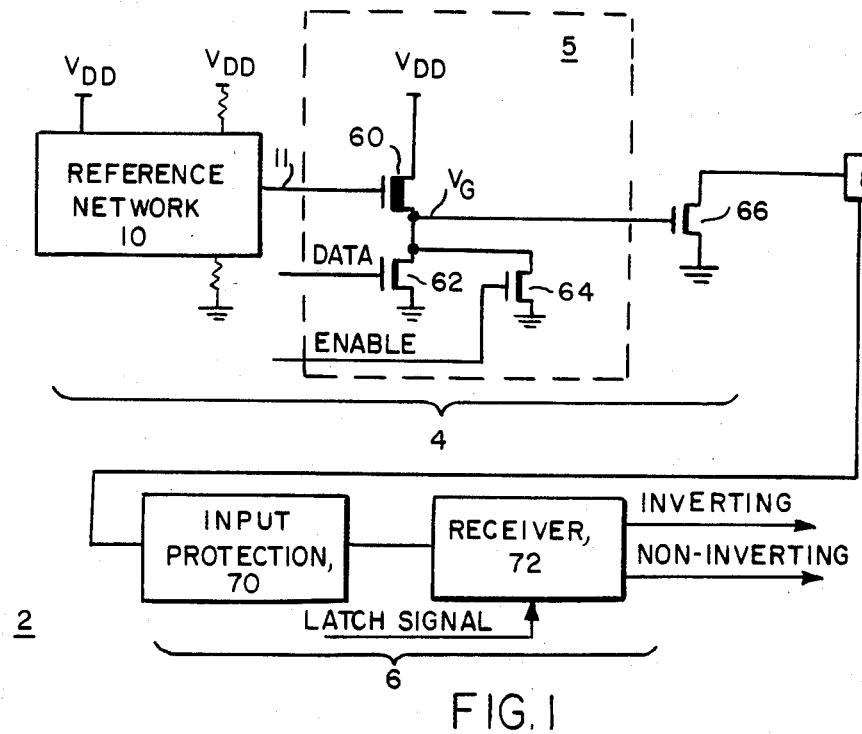
FIG. 1 shows a partly block and partly circuit diagram of the transceiver of the present invention.

Referring now to FIG. 1 there is shown the transceiver 2 of the present invention. Transceiver 2 is part of an integrated circuit, the rest of which is not shown for clarity, and is formed by a driver portion 4 and a receiver portion 6.

Driver portion 4 is formed by a voltage reference network 10 whose output is coupled to the gate of depletion transistor 60. A data signal, generated elsewhere on the integrated circuit, is fed to the gate of transistor 62 and an enable signal, also generated elsewhere in the integrated circuit, is fed to the gate of transistor 64. Depletion transistor 60 and enhancement transistors 62 and 64 form a two-input (one for data and the other for enable load signals) NOR gate which is used as the pre-driver 5 for the data signal. Such a buffer gate is conventional except for the control of the gate voltage of depletion transistor 60 by the reference network 10. A more detailed description of reference network 10 will be found hereinafter; suffice it to say for now that the effective resistance of transistor 60, i.e. the pull-up device, is controlled by reference network 10. The output of the buffer gate, in other words the node $V_g$ corresponding to the source of transistor 60, is coupled to the gate of open-drain enhancement transistor 66 which is used as the driver element for terminal pad 8. The connection is of the open-drain type where a low voltage is the active state.

The gate capacitance of driver transistor 66 and the resistance of depletion transistor 60 form an RC network. In order to limit the value of peak currents occuring during the operation of the driver portion of transceiver 2, the time to charge node $V_g$ and discharge the capacitance of pad 8 must be as long as possible within the selected operating cycle time. This time is maintained constant at its optimum value over variation of device characteristics, due for instance to temperature and/or process variations, by varying the resistance of the depletion transistor 60, i.e. the R in the RC network, to maintain a constant RC value.

Even though only a single stage comprising pre-driver 5 and driver 66 stage is shown on the drawing for simplicity, it should be understood that a plurality of such stages can be connected to a single pad 8, with the gate of all of the pre-driver's depletion devices being controlled by a single reference network 10.

Receiver portion 6 is formed by a conventional input protection network 70 coupled to bus pad 8. Input protection network 70 may be formed by a series resistor and a shunt transistor biased to perform as a diode. The input signal going through protection network 70 is then fed to receiver 72 which provides an inverting and a non-inverting restored output signal corresponding to the input signal present on the input pad 8. Receiver 72 will be explained in more detail hereinafter, suffice it to say for now that it comprises a modified differential amplifier having gain and feed-back for narrowing the "high or low" decision window and for producing a predetermined amount of hysteresis for high noise immunity.

Figure 2:
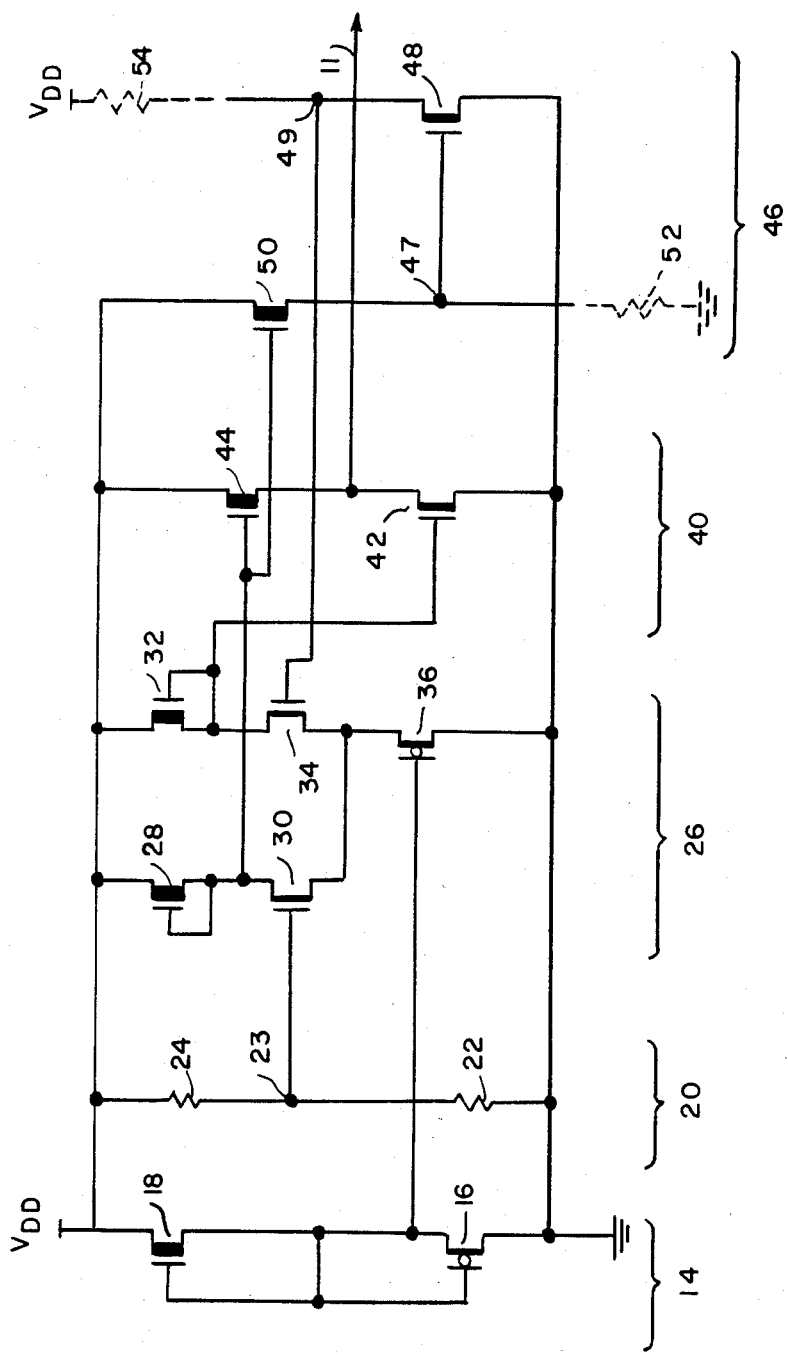
FIG. 2 shows a detailed circuit diagram of the reference network in FIG. 1.

Referring now to FIG. 2, there is shown a detailed circuit diagram of voltage reference network 10. The network 10 comprises a current mirror section 14, a D.C. bias section 20, a differential amplifier section 26, a buffer section 40 and a compensating network 46. Differential amplifier section 26 comprises two similar branches. One branch is formed by depletion transistor 28 and enhancement transistor 30 and the other by depletion transistor 32 and enhancement transistor 34. Shallow enhancement transistor 36 forms a constant current sink for these two branches. Shallow enhancement transistors are distinguished in the drawing from the normal enhancement transistors by the inclusion of a small circle between the gate and source-drain symbols. The size of transistor 36 (i.e. width to length ratio) must be sufficiently large to sink an amount of current sufficient to obtain the desired low state voltage at the outputs of the differential amplifier. Current mirror 14, formed by depletion transistor 18 and shallow enhancement transistor 16 are sized to set the gate voltage of current sink transistor 36 slightly above its threshold voltage. Transistors 18 and 16 are scaled in proportion to like-type transistors 28 32 and 36. The operation of current mirror section 14 and differential amplifier section 26 may be better understood by considering that if the threshold voltage of transistor 16 increases, for instance due to temperature or process variations, then the voltage on the gate of transistor 36 increases to compensate for a corresponding increase in the threshold voltage of like-type transistor 36.

The D.C. bias section 20 comprises a voltage divider formed by polysilicon resistors 22 and 24. They are sized large enough to minimize D.C. power dissipation while providing a reference voltage on the gate of differential amplifier transistor 30 sufficient to set the operating parameters of differential amplifier section 26 in the middle of its dynamic range.

Compensating section 46 comprises depletion transistor 50 and enhancement transistor 48, which are part of the integrated circuit chip, and precision resistors 52 and 54, which are external to the integrated circuit chip. The relative transistor sizes are scaled to the pre-driver's depletion transistor 60 and driver's enhancement transistor 66. In other words the size of depletion transistor 50 relative to enhancement transistor 48 is the same as the size of depletion transistor 60 relative to enhancement transistor 66. The compensating section essentially compares the resistance of transistor 50 with the resistance of external resistor 52 and the resistance of transistor 48 with the resistance of external resistor 54. If transistor 50 is more conductive than the nominal amount, due to temperature and/or process variations then the voltage at node 47 will rise, causing the voltage at node 49 to fall; if transistor 50 is less conductive, then the voltage at node 49 will rise. If transistor 48 becomes more conductive than the nominal amount then the voltage at node 49 will decrease, and if transistor 48 becomes less conductive, the voltage at node 49 will increase. Thus, compensating transistor 50 acts as a pull-up device, just like corresponding driver transistor 60, and compensating transistor 48 acts as a pull-down device, just like corresponding pre-driver transistor 66. Node 49 is connected to the non-inverting input of the differential amplifier. Buffer section 40, formed by depletion transistor 44, whose gate is tied to the non-inverting output of differential amplifier 26, and enhancement transistor 42, whose gate is tied to the inverting output of differential amplifier 26, is used of produce the differential output 11.

Output 11 is thus generated as the difference of a voltage representative of the actual depletion and enhancement devices characteristics (node 49) and a reference voltage (node 23). This output is fed to the gate of the depletion device 60 of pre-driver 5 to modulate its resistance as variations in the characteristics of depletion and enhancement devices occur, thus maintaining a constant RC for the driver and reducing current peaks. That is, as the conductance of transistors 60 and 66 varies, the gate voltage of 60 changes in an opposite direction to keep RC constant.

Transistors 42 and 44 are sized to maintain the dynamic range of the differential amplifier as wide as possible while appropriately accommodating temperature and/or process variations. For instance, they are sized to produce, for the fast corner of the process (i.e. fast transistor characteristics for both depletion and enhancement type), an output voltage equal to ground, and for the slow corner of the process (i.e. slow transistor characteristics for both depletion and enhancement type) an output voltage equal to the supply Vdd.

Figure 3:
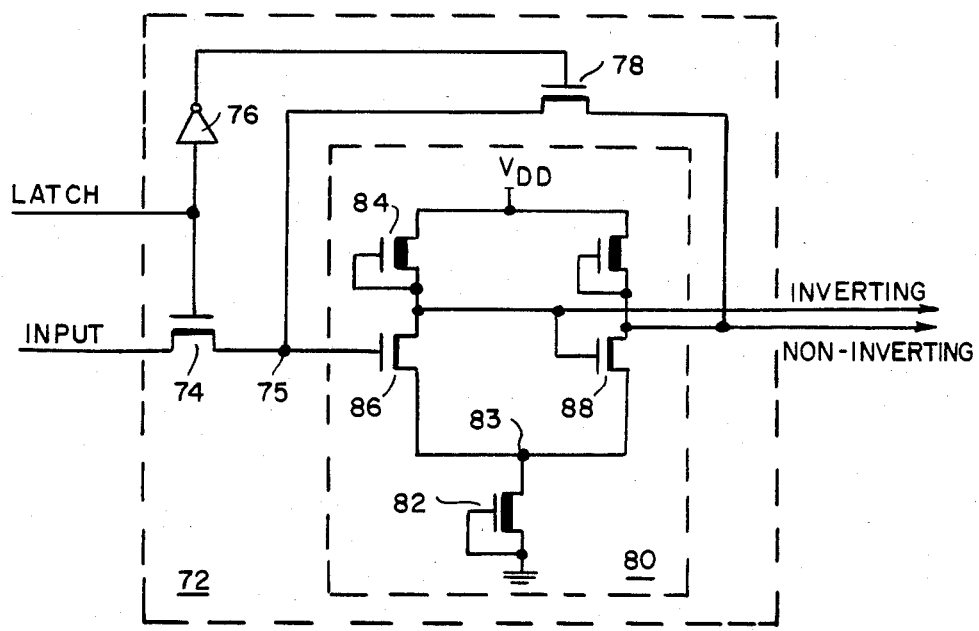
FIG. 3 shows a detailed circuit diagram of the receiver network in FIG. 1.

Referring now to FIG. 3, there is shown a more detailed circuit diagram for receiver 72. Transistors 74 and 78 together with modified differential amplifier 80, from a latch for the data signal received from the input protection network 70.

In differential amplifier 80, depletion transistor 82, with its negative threshold voltage, is not a true constant current sink, thus differential amplifier 80 is not a true differential amplifier. However, transistor 82 behaves essentially as a resistor and it forms a voltage divider in conjunction with depletion transistor 84. The size of the transistor 82 is greater than size of transistor 84 by an amount sufficient to produce a voltage output for the low-state as low as possible. Enhancement transistor 86 is fully on if the data signal's input voltage is at a value corresponding to the minimum guaranteed high state (i.e. a logic "1") present on the input line, and conversely it is fully off if the data voltage present on the input line is at the maximum guaranteed for a low-state (i.e. a logic "0"). The inverting output is fed to the gate of enhancement transistor 88, thus as the gate voltage of transistor 86, i.e. the input voltage, falls, the inverting output rises which causes transistor 88 to turn on. The voltage at node 83 then rises which helps to shut off transistor 86 even faster. If the input voltage rises, then the voltage at the gate of transistor 86 rises causing the inverting output to fall. This in turn reduces the current flowing through transistor 88 causing more current to flow through transistor 86, thus the turn-on of transistor 86 is even faster. A pre-determined amount of hysteresis, desirable to reduce noise-induced switching, is obtained by the relative sizing of the two branches and the current sinking of differential amplifier 80, as is known in the art.

Feeding-back the inverting output to the non-inverting input causes the outputs to reach their corresponding low-state or high-state values with input voltages higher than the low-state maximum guaranteed voltage and lower than the high-state minimum guaranteed voltage, respectively. This effectively narrows the high-state/low-state decision window which, in conjunction with the hysteresis characteristics, provides for better noise immunity than conventional disigns.

Transistors 74, 78 and inverter 76 are used to latch the data in response to a latch enable signal generated conventionally elsewhere on the integrated circuit. With transistor 74 turned on the input data is present on node 75 and differential amplifier 80 follows it as explained above. Deasserting the latch enable signal shuts off transistor 74 and turns on, through inverter 76, feedback transistor 78. Now the non-inverting output is fed back to the input node 75 and the data is latched.

This completes the description of the present invention. Some modification will be apparent to persons skilled in the art without departing from the spirit and scope of this invention. Accordingly, it is intended that this invention be not limited to the embodiments disclosed herein except as defined by the the appended claims.

What is claimed is:

1. A bus driver system in a monolithic integrated circuit for driving an external bus in response to a data signal, the system comprising:

A. selectively energizable driver means for connection to the external bus and having an energized state and a de-energized state, said driver means driving the bus when in the energized state;
   B. pre-driver means connected to said driver means for selectively energizing and de-energizing said driver means in response to the data signal and a reference signal, said pre-driver means being responsive to the reference signal to adjust the rate at which it switches said driver means between energized and de-energized states;
   C. reference means connected to said pre-driver means for generating said reference signal, said reference means comprising:
      i. characteristic reference signal generating means comprising pre-driver compensating means and driver compensating means each having a electrical characteristic which varies with variations in the same electrical characteristic in said pre-driver means and said driver means, respectively, said driver compensating means and said pre-driver compensating means being interconnected to generate a characteristic reference signal, and
      ii. reference signal generating means for generating said reference signal in response to said characteristic reference signal.

2. A bus driver system as defined in claim 1 wherein said reference signal generating means includes amplifier means connected to receive said characteristic reference signal and generating an amplified characteristic reference signal in response thereto, and a buffer means responsive to the signal from said amplifier means for generating said reference signal.

3. A bus drive system as defined in claim 2 wherein said amplifer means comprises:

A. differential amplifier means for generating said amplified characteristic reference signal including a reference branch and a control branch each having a transistor having a source terminal connected to a control node controlled by a current source means controlled by a current source control signal, said reference branch transistor being controlled by a differential reference signal and said control branch transistor being controlled by said characteristic reference signal, said amplified characteristic reference signal comprising the combined differential output signals of said reference transistor and said control transistor,
   B. differential reference signal generating means comprising voltage divider means for generating said reference signal, and
   C. current source control means comprising a current mirror circuit means for generating said current source control signal.

4. A bus driver system as defined in claim 3 wherein each said reference branch and said control branch further includes a voltage drop transistor means connected to a voltage supply and to said respective reference transistor and control transistor, each voltage drop transistor means for providing a voltage drop proportional to the current passing through the respective branch, said current source means further comprising a current source transistor means connected between said control node and a ground reference terminal, said current mirror means comprising serially connected transistor means having electrical characteristics related to the electrical characteristics of both said voltage drop transistor means and said current source transistor means.

5. A bus driver system as defined in claim 3 wherein said buffer means comprises a pair of serially-connected buffer transistor means each controlled by one of the differential output signals from said differential amplifier means, said reference signal being taken from the node between said buffer transistor means.

6. A bus driver system as defined in claim 4 wherein each said pre-driver compensating means and said driver compensating means comprises transistor means connected to precision resistor means, said pre-driver compensating means being controlled by the output signal from said control branch of said differential amplifier means, said pre-driver compensating means generating an output signal for controlling said driver compensating means, said driver compensating means generating said control signal for controlling said control branch of said differential amplifier means.

7. A bus transceiver system in a monolithic integrated circuit for driving an external bus in response to a data signal and for receiving data signals from said bus, the system comprising:
A. selectively energizable driver means for connection to the external bus and having an energized state and a de-energized state, said driver means driving the bus when in the energized state;
B. pre-driver means connected to said driver means for selectively energizing and de-energizing said driver means in response to the data signal and a reference signal, said pre-driver means being responsive to the reference signal to adjust the rate at which it switches said driver means between energized and de-energized states;
C. reference means connected to said pre-driver means for generating said reference signal, said reference means comprising:
  i. characteristic reference signal generating means comprising pre-driver compensating means and driver compensating means each having a electrical characteristic which varies with variations in the same electrical characteristic in said pre-driver means and said driver means, respectively, said driver compensating means and said pre-driver compensating means being interconnected to generate a characteristic reference signal, and
  ii. reference signal generating means for generating said reference signal in response to said characteristic reference signal; and
D. a receiver stage for connection to said bus and including high-gain means for producing a voltage output signal as a function of a signal on said bus.

8. A bus transceiver system as defined in claim 7 wherein said reference signal generating means includes amplifier means connected to receive said characteristic reference signal and generating an amplified characteristic reference signal in response thereto, and a buffer means responsive to the signal from said amplifier means for generating said reference signal.

9. A bus transceiver system as defined in claim 8 wherein said amplfer means comprises:
A. differential amplifier means for generating said amplified characteristic reference signal including a reference branch and a control branch each having a transistor having a source terminal connected to a control node controlled by a current source means controlled by a current source control signal, said reference branch transistor being controlled by a differential reference signal and said control branch transistor being controlled by said characteristic reference signal, said amplified characteristic reference signal comprising the combined differential output signals of said reference transistor and said control transistor,
B. differential reference signal generating means comprising voltage divider means for generating said reference signal, and
C. current source control means comprising a current mirror circuit means for generating said current source control signal.

10. A bus transceiver system as defined in claim 9 wherein each said reference branch and said control branch further includes a voltage drop transistor means connected to a voltage supply and to said respective reference transistor and control transistor, each voltage drop transistor means for providing a voltage drop proportional to the current passing through the respective branch, said current source means further comprising a current source transistor means connected between said control node and a ground reference terminal, said current mirror means comprising serially connected transistor means having electrical characteristics related to the electrical characteristics of both said voltage drop transistor means and said current source transistor means.

11. A bus transceiver system as defined in claim 9 wherein said buffer means comprises a pair of serially-connected buffer transistor means each controlled by one of the differential output signals from said differential amplifier means, said reference signal being taken from the node between said buffer transistor means.

12. A bus transceiver system as defined in claim 10 wherein each said pre-driver compensating means and said driver compensating means comprises transistor means connected to precision resistor means, said pre-driver compensating means being controlled by the output signal from said control branch of said differential amplifier means, said pre-driver compensating means generating an output signal for controlling said driver compensating means, said driver compensating means generating said control signal for controlling said control branch of said differential amplifier means.

* * * * *